United States Patent
Wu

(10) Patent No.: US 11,736,099 B1
(45) Date of Patent: Aug. 22, 2023

(54) CLOCK DETECTING CIRCUIT

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/887,495

(22) Filed: Aug. 14, 2022

(51) Int. Cl.
- *H03K 5/00* (2006.01)
- *H03K 5/24* (2006.01)
- *H03K 19/17784* (2020.01)
- *H03K 5/1534* (2006.01)
- *H03K 5/14* (2014.01)
- *H03K 5/26* (2006.01)

(52) U.S. Cl.
CPC ............ *H03K 5/2472* (2013.01); *H03K 5/14* (2013.01); *H03K 5/1534* (2013.01); *H03K 5/26* (2013.01); *H03K 19/17784* (2013.01)

(58) Field of Classification Search
CPC ...... H03K 19/17784; H03K 5/14; H03K 5/26; H03K 5/2472; H03K 5/1534; H03L 17/091

See application file for complete search history.

(56) References Cited

U.S. PATENT DOCUMENTS

| | | | | |
|---|---|---|---|---|
| 5,306,963 A * | 4/1994 | Leak | .......... | G11C 8/18 |
| | | | | 365/233.5 |
| 5,926,042 A * | 7/1999 | Talaga, Jr. | ............ | H03K 5/19 |
| | | | | 327/132 |
| 6,081,137 A * | 6/2000 | Choi | ............ | H03K 5/1534 |
| | | | | 327/43 |
| 6,668,334 B1 * | 12/2003 | Abel | .......... | H03K 5/19 |
| | | | | 713/502 |
| 8,203,363 B2 * | 6/2012 | Huang | ............ | G01R 23/09 |
| | | | | 327/39 |
| 9,413,295 B1 * | 8/2016 | Chang | ............ | H03K 5/26 |
| 10,014,849 B2 * | 7/2018 | Noh | .......... | H03K 19/21 |
| 2006/0044022 A1 * | 3/2006 | Tayler | ............ | H03K 5/1534 |
| | | | | 327/24 |
| 2010/0019802 A1 * | 1/2010 | Huang | ............ | H03D 13/00 |
| | | | | 327/8 |
| 2016/0344380 A1 * | 11/2016 | Chang | ............ | H03D 13/004 |

* cited by examiner

*Primary Examiner* — Tuan T Lam
(74) *Attorney, Agent, or Firm* — JCIPRNET

(57) ABSTRACT

A clock detecting circuit is provided. The clock detecting circuit includes a first clock converting circuit, a second clock converting circuit and a frequency comparator. The first clock converting circuit converts an internal clock to a first clock. The second clock converting circuit converts an external clock to a second clock. The frequency comparator generates a first edge clock in response the first clock and generates a second edge clock in response the second clock. The frequency comparator generates a first sensing voltage in response to a plurality of positive pulses of the first edge clock and generate a second sensing voltage in response to a plurality of positive pulses of the second edge clock. The frequency comparator compares the first sensing voltage and the second sensing voltage to provide a frequency comparing result between the external clock and the internal clock.

19 Claims, 12 Drawing Sheets

230

CLOCK DETECTING CIRCUIT

BACKGROUND

Technical Field

The disclosure generally relates to a clock detecting circuit, and more particularly to a clock detecting circuit for detecting a frequency of a clock.

DESCRIPTION OF RELATED ART

Generally, in order to make a frequency accurate of a clock, a chip having the clock includes a circuit such as Phase-Locked Loops (PLL), Delay-Locked, Loops (DLL), etc. The circuit includes a phase detector. The phase detector is used to detect a phase difference between an external clock signal and an internal clock signal and adjust a phase of the internal clock signal to match a phase of the external clock signal.

However, the phase detector has a blind spot. The phase detector cannot detect a frequency of the external clock. If the frequency of the external clock is much higher than or much lower than a frequency of the internal clock, the phase detector may cause risks of misinterpretation and/or stuck locking. The chip has high power consumption and low signal quality based on the above risks. Therefore, it is necessary to provide a clock detecting circuit for detecting the frequency of the external clock.

SUMMARY

The disclosure is related to a clock detecting circuit for detecting the frequency of the external clock.

The disclosure provides an electronic device. The clock detecting circuit includes a first clock converting circuit, a second clock converting circuit and a frequency comparator. The first clock converting circuit receives an internal clock and converts the internal clock to a first clock. The second clock converting circuit receives an external clock, and converts the external clock to a second clock. The frequency comparator is coupled to the first clock converting circuit and the second clock converting circuit. The frequency comparator generates a first edge clock in response to a signal edge of the first clock and generates a second edge clock in response to a signal edge of the second clock. The frequency comparator generates a first sensing voltage in response to a plurality of positive pulses of the first edge clock and generates a second sensing voltage in response to a plurality of positive pulses of the second edge clock. The frequency comparator compares the first sensing voltage and the second sensing voltage to provide a frequency comparing result between the external clock and the internal clock.

The disclosure provides an electronic device. The clock detecting circuit includes a first sensing voltage generator, a second sensing voltage generator and a decision device. The first sensing voltage generator generates a first sensing voltage based on a frequency of a first clock associated with a clock on a first signal path. The second sensing voltage generator generates a second sensing voltage based on a frequency of a second clock associated with a clock on a second signal path. The decision device is coupled to the first voltage generator and the second voltage generator. The decision device compares the first sensing voltage with a decision voltage to provide a first result signal, compares the second sensing voltage with the decision voltage to provide a second result signal, and samples the first result signal and the second result signal as a frequency comparing result.

Based on the above description, the first clock converting circuit converts the internal clock to the first clock. The second clock converting circuit converts the external clock to the second clock. The frequency comparator generates the first sensing voltage based on the first clock and generates the second sensing voltage based on the second clock. The frequency comparator compares the first sensing voltage and the second sensing voltage to provide the frequency comparing result between the external clock and the internal clock. Therefore, a frequency relationship between the frequency of the external clock and the frequency of the internal clock would be obtained.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
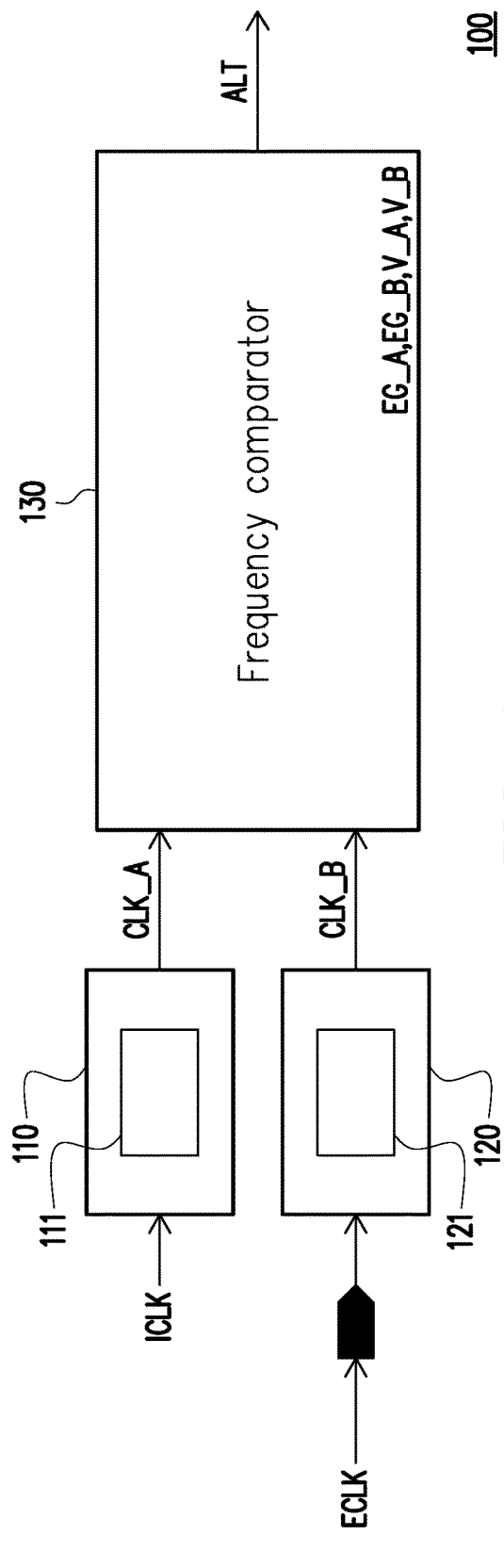
FIG. 1 illustrates a schematic diagram of a clock detecting circuit according to an embodiment of the disclosure.

FIG. 1 illustrates a schematic diagram of a clock detecting circuit according to an embodiment of the disclosure. Referring to FIG. 1, in the embodiment, the clock detecting circuit 100 includes a first clock converting circuit 110, a second clock converting circuit 120 and a frequency comparator 130. The first clock converting circuit 110 receives a clock ICLK. The first clock converting circuit 110 converts the clock ICLK to a first clock CLK_A. The second clock converting circuit 120 receives a clock ECLK. The second clock converting circuit 120 converts the clock ECLK to a second clock CLK_B.

In the embodiment, the frequency comparator 130 is coupled to the first clock converting circuit 110 and the second clock converting circuit 120. The frequency comparator 130 receives the first clock CLK_A from the first clock converting circuit 110 and receives the second clock CLK_B from the second clock converting circuit 120. The frequency comparator 130 generates a first edge clock EG_A in response to a signal edge of the first clock CLK_A and generates a second edge clock EG_B in response to a signal edge of the second clock CLK_B. The frequency comparator 130 generates a first sensing voltage V_A in response to positive pulses of the first edge clock EG_A and generates a second sensing voltage V_B in response to positive pulses of the second edge clock EG_B. Besides, the frequency comparator 130 compares the first sensing voltage V_A and the second sensing voltage V_B to provide a frequency comparing result ALT.

It should be noted, the first sensing voltage V_A is associated with the clock ICLK. The second sensing voltage V_B is associated with the clock ECLK. In other words, the frequency comparator 130 provides the frequency comparing result ALT between the clock ECLK and the clock ICLK. Therefore, based on a frequency relationship between the frequency of the clock ECLK and the frequency of the internal clock ICLK would be obtained.

In the embodiment, the clock ICLK may be a reference clock generated by an internal oscillator. Therefore, the frequency of the clock ICLK is known. The first clock converting circuit 110 comprises a frequency dividing circuit 111. Based on design requirements, the frequency of the clock ICLK is operated as a first integer multiple of the frequency of the first clock CLK_A. Therefore, the frequency of the first clock CLK_A and a frequency of the first edge clock EG_A are associated with the frequency of the clock ICLK. Besides, the frequency of the first clock CLK_A and a frequency of the first edge clock EG_A are also known.

For example, the clock ICLK may be an internal clock generated in the clock detecting circuit 100, but the disclosure is not limited thereto. For example, the clock ECLK may be an external clock, but the disclosure is not limited thereto. In the embodiment, the second clock converting circuit 120 may receive the clock ECLK through an input pad of the clock detecting circuit 100, but the disclosure is not limited thereto. Therefore, the clock detecting circuit 100 may be an external clock detecting circuit, but the disclosure is not limited thereto. The second clock converting circuit 120 comprises a frequency dividing circuit 121. Based on design requirements, the frequency of the clock ECLK is operated as a second integer multiple of the frequency of the second clock CLK_B. Therefore, the frequency of the second clock CLK_B and a frequency of the second edge clock EG_B are associated with the frequency of the clock ECLK. The first integer multiple and the second integer multiple may be adjusted based on design requirements.

Based on the frequency comparing result ALT, the frequency of the clock ICLK, the first integer multiple and the second integer multiple, the frequency of the clock ECLK may be obtained. The frequency comparing result ALT can help to decision and optimize a power consumption and a related circuit performance setting of components (such as receiver, PLL, DLL, POR, transmitter circuit, etc.) in the chip receiving the clock ECLK.

In some embodiments, based on design requirements, at least one of the first clock converting circuit 110 and the second clock converting circuit 120 may be omitted. Therefore, in some embodiments, the frequency of the clock ICLK is substantially equal to the frequency of the first clock CLK_A. In some embodiments, the frequency of the clock ECLK is substantially equal to the second clock CLK_B.

Figure 2:
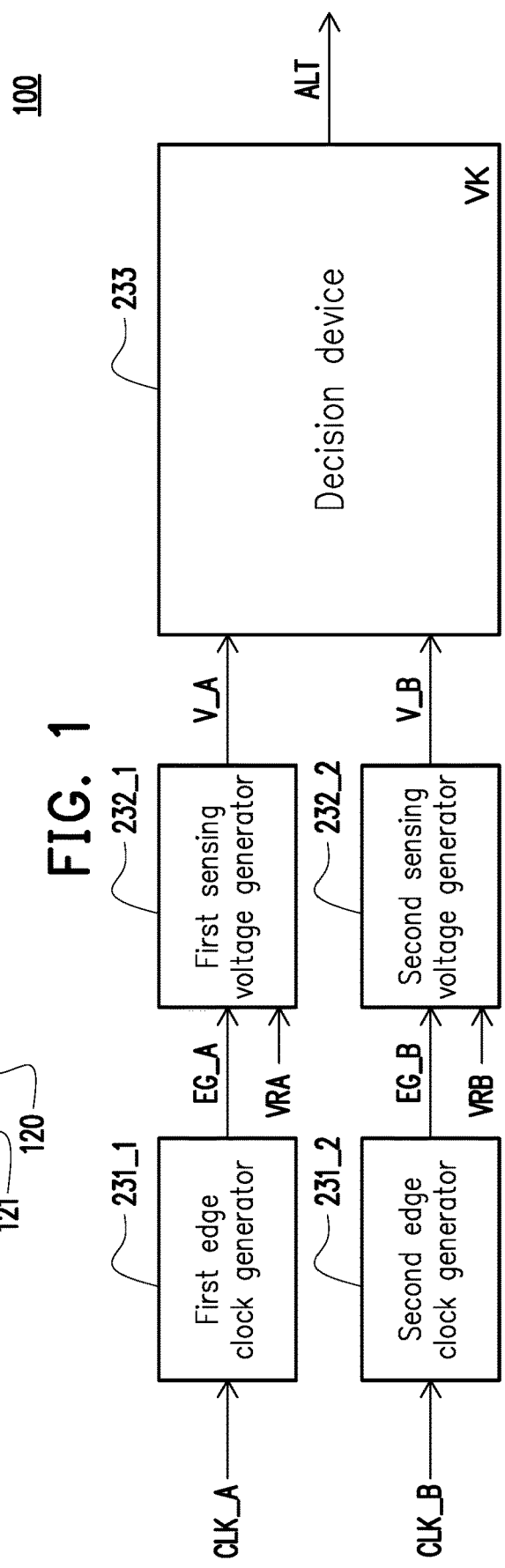
FIG. 2 illustrates a schematic diagram of a frequency comparator according to an embodiment of the disclosure.

FIG. 2 illustrates a schematic diagram of a frequency comparator according to an embodiment of the disclosure. The frequency comparator 230 may be used as the frequency comparator 130 in FIG. 1. Referring to FIG. 1 and FIG. 2, in the embodiment, the frequency comparator 230 includes a first edge clock generator 231_1, a second edge clock generator 231_2, a first sensing voltage generator 232_1, a second sensing voltage generator 232_2 and a decision device 233. The first edge clock generator 231_1 is coupled to the first clock converting circuit 110. The first edge clock generator 231_1 generates the first edge clock EG_A in response to least one of a rising edge and a falling edge of the first clock CLK_A. The second edge clock generator 231_2 is coupled to the second clock converting circuit 120. The second edge clock generator 231_2 generates the second edge clock in response to least one of a rising edge and a falling edge of the second clock CLK_B.

In the embodiment, the first sensing voltage generator 232_1 receives the first edge clock EG_A and generates the first sensing voltage V_A based on the positive pulses of the first edge clock EG_A. The second sensing voltage generator 232_2 receives the second edge clock EG_B and generates the second sensing voltage V_B based on the positive pulses of the second edge clock EG_B.

In the embodiment, the first edge clock generator 231_1 and the first clock converting circuit 110 are acted as a first signal path. Therefore, the first sensing voltage generator 232_1 generates the first sensing voltage V_A based on the frequency of the first clock CLK_A associated with the clock ICLK on the first signal path. In the embodiment, the second sensing voltage generator 232_2 and the second clock converting circuit 120 are acted as a second signal path. Therefore, second sensing voltage generator 232_2 generates the second sensing voltage V_B based on the frequency of the second clock CLK_B associated with the clock ECLK on the second signal path.

The decision device 233 receives the first sensing voltage V_A and the second sensing voltage V_B. The decision device 233 compares the first sensing voltage V_A with a decision voltage VK to provide a first result signal SP_A during a sensing period. The decision device 233 compares the second sensing voltage V_B with the decision voltage VK to provide a second result signal SP_B during the sensing period. Besides, the decision device 233 samples the first result signal SP_A and the second result signal SP_B as the frequency comparing result ALT based on a sampling clock SCLK. The sensing period is associated with a period of the sampling clock SCLK.

In the embodiment, the first sensing voltage generator 232_1 raises the first sensing voltage V_A based on the positive pulses of the first edge clock EG_A associated with the frequency of the clock ICLK during the sensing period. The second sensing voltage generator 232_2 raises the second sensing voltage V_B based on the positive pulses of the second edge clock EG_B associated with the frequency of the clock ECLK during the sensing period. The decision device 233 judges a voltage level of the first sensing voltage V_A and a voltage level of the second sensing voltage V_B based on the decision voltage VK. If the voltage level of the first sensing voltage V_A reaches the voltage level of VK earlier, the frequency of first edge clock EG_A is higher than the frequency of second edge clock EG_B. If the voltage level of the second sensing voltage V_B reaches the voltage level of VK earlier, the frequency of first edge clock EG_A is lower than the frequency of second edge clock EG_B. If the voltage level of the first sensing voltage V_A and the voltage level of the second sensing voltage V_B reaches the voltage level of VK at the same time, the frequency of first edge clock EG_A is approximately equal to the frequency of second edge clock EG_B. Therefore, the frequency relationship between the frequency of the clock ECLK and the frequency of the clock ICLK would be obtained.

In the embodiment, the first sensing voltage generator 232_1 may raise the first sensing voltage V_A based on a first reference voltage VRA. The second sensing voltage generator 232_2 may raise the second sensing voltage V_B based on a second reference voltage VRB. The first sensing voltage generator 232_1 raises the first sensing voltage V_A until the first sensing voltage V_A reaches to the first reference voltage VRA. The second sensing voltage generator 332_2 raises the second sensing voltage V_B until the second sensing voltage V_B reaches to the second reference voltage VRB. Therefore, a raising speed of the voltage level of the first sensing voltage V_A is adjusted by a voltage level of the first reference voltage VRA. A raising speed of the voltage level of the second sensing voltage V_B is adjusted by a voltage level of the second reference voltage VRB. The voltage level of the first reference voltage VRA and the voltage level of the second reference voltage VRB may be the same each other or not. When a difference between the frequency of the clock ECLK and the frequency of the clock ICLK is very large, a difference between the first sensing voltage V_A and the second sensing voltage V_B may be large. The large difference between the first sensing voltage V_A and the second sensing voltage V_B may cause the decision device 233 abnormal. Therefore, at least one of the first reference voltage VRA and the second reference voltage VRB may be adjusted, so as to decrease the large difference between the first sensing voltage V_A and the second sensing voltage V_B.

Figure 3:
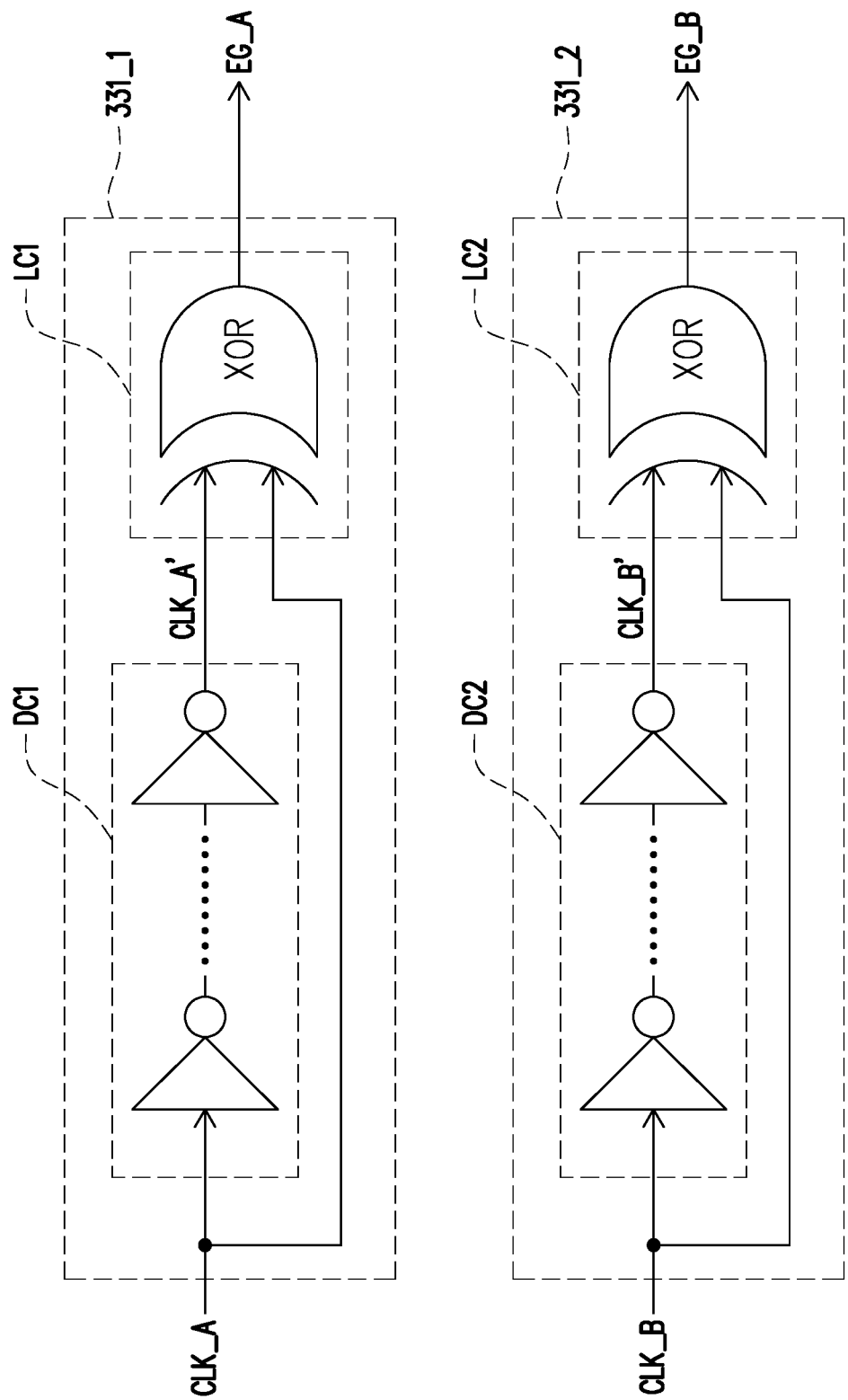
FIG. 3 illustrates a schematic diagram of a first edge clock generator and a second edge clock generator according to an embodiment of the disclosure.

FIG. 3 illustrates a schematic diagram of a first edge clock generator and a second edge clock generator according to an embodiment of the disclosure. Referring to FIG. 3, in the embodiment, the first edge clock generator 331_1 includes a delay chain DC1 and a logic circuit LC1. The delay chain DC1 delays the first clock CLK_A to generate a delayed first clock CLK_A'. For example, in an embodiment, the delay chain DC1 includes even number of inverters connected in series. In an embodiment, the delay chain DC1 includes at least one delay buffer connected in series.

The logic circuit LC1 receives the delayed first clock CLK_A' and the first clock CLK_A, and generates the first edge clock EG_A based on a phase difference between the delayed first clock CLK_A' and the first clock CLK_A. For example, the logic circuit LC1 includes a XOR gate. The XOR gate performs a logic XOR operation on the delayed first clock CLK_A' and the first clock CLK_A to generate the first edge clock EG_A.

Figure 4:
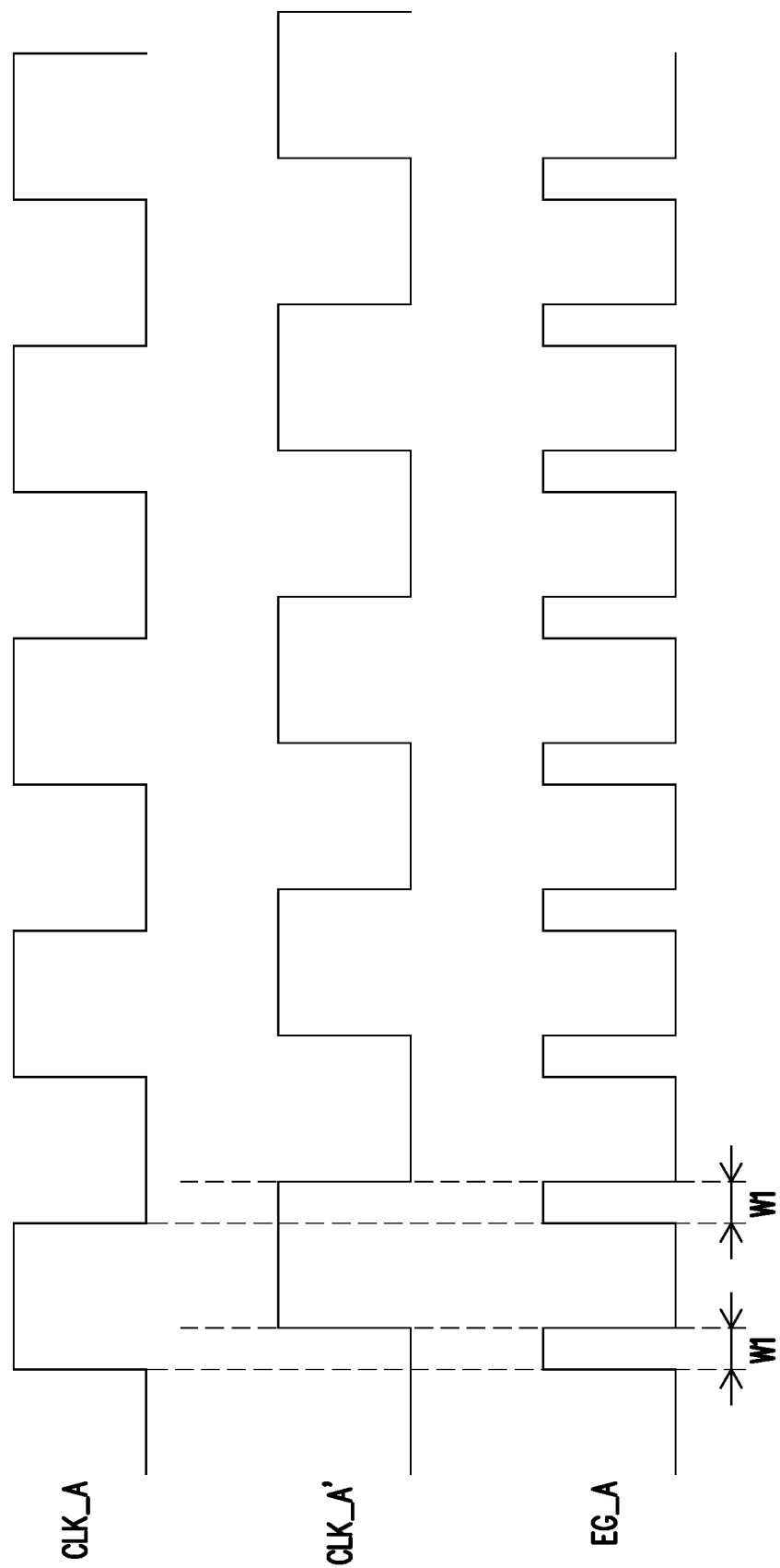
FIG. 4 illustrates an operating timing diagram of a first edge clock generator of FIG. 3.

FIG. 4 illustrates an operating timing diagram of a first edge clock generator of FIG. 3. Referring to FIG. 3 and FIG. 4, in the embodiment, a width W1 of the positive pulses of the first edge clock EG_A is associated with phase difference between the delayed first clock CLK_A' and the first clock CLK_A. Therefore, the width W1 of the positive pulses of the first edge clock EG_A may be adjusted by a design of the delay chain DC1. In the embodiment, the positive pulses of the first edge clock EG_A are generated based on the rising edge and the falling edge of the first clock CLK_A. Therefore, the frequency of the first edge clock EG_A is equal to twice the frequency of the first clock CLK_A.

Referring to FIG. 3 again, in the embodiment, the second edge clock generator 331_2 includes a delay chain DC2 and a logic circuit LC2. The delay chain DC2 delays the second clock CLK_B to generate a delayed second clock CLK_B'. For example, in an embodiment, the delay chain DC2 includes even number of inverters connected in series. In an embodiment, the delay chain DC2 includes at least one delay buffer connected in series.

The logic circuit LC2 receives the delayed second clock CLK_B' and the second clock CLK_B, and generates the second edge clock EG_B based on a phase difference between the delayed second clock CLK_B' and the second clock CLK_B. For example, the logic circuit LC2 includes a XOR gate. The XOR gate performs a logic XOR operation on the delayed second clock CLK_B' and the second clock CLK_B to generate the second edge clock EG_B.

Similar to the width W1 of the positive pulses of the first edge clock EG_A, a width of the positive pulses of the second edge clock EG_B is associated with phase difference between the delayed second clock CLK_B' and the second clock CLK_B. Therefore, the width of the positive pulses of the second edge clock EG_B may be adjusted by a design of the delay chain DC2. In the embodiment, the positive pulses of the second edge clock EG_B are generated based on the rising edge and the falling edge of the second clock CLK_B. Therefore, the frequency of the second edge clock EG_B is equal to twice the frequency of the second clock CLK_B.

Figure 5:
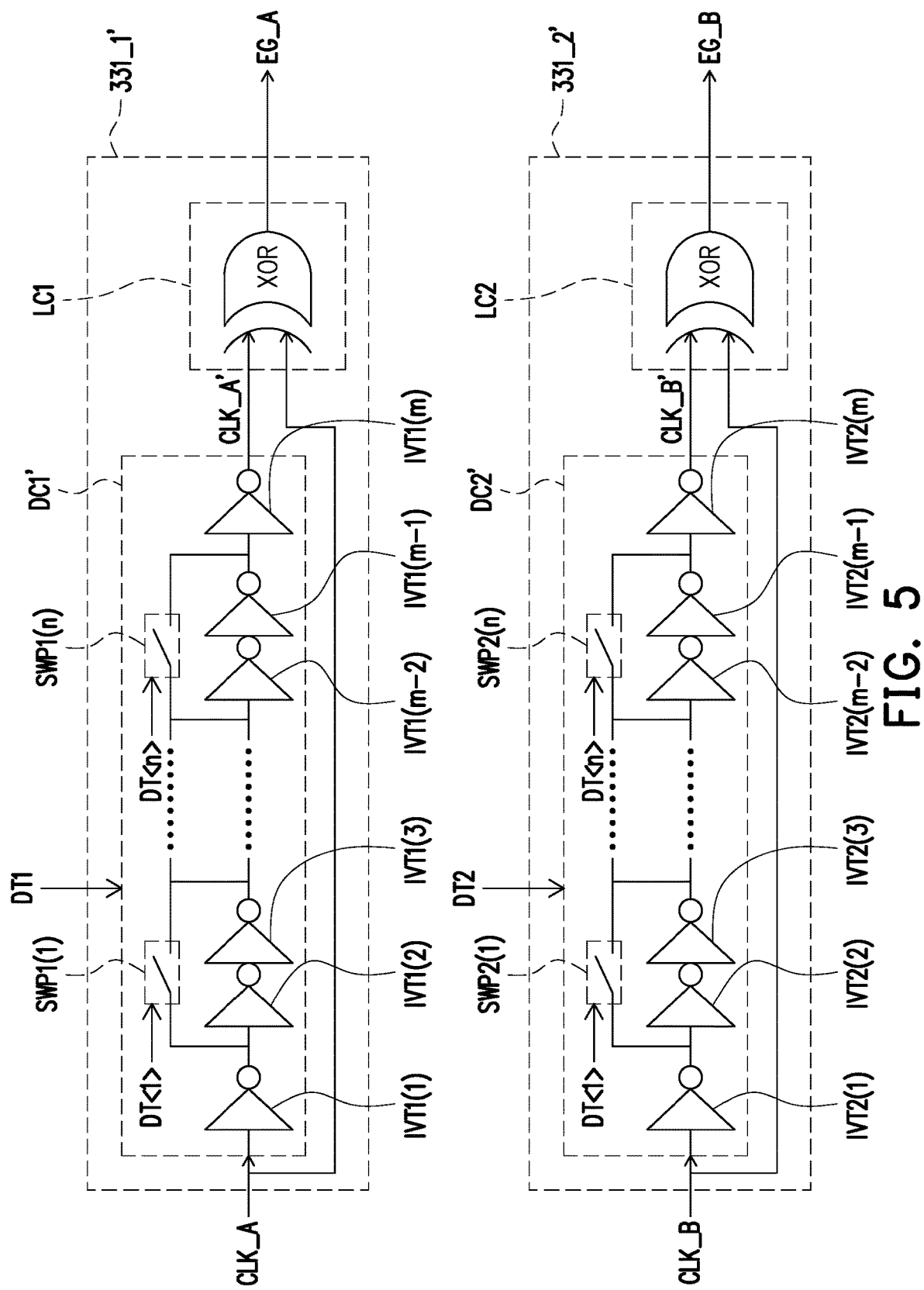
FIG. 5 illustrates a schematic diagram of a first edge clock generator and a second edge clock generator capable of adjusting width of positive pulses of edge clocks according to an embodiment of the disclosure.

FIG. 5 illustrates a schematic diagram of a first edge clock generator and a second edge clock generator capable of adjusting width of positive pulses of edge clocks according to an embodiment of the disclosure. Referring to FIG. 5, in the embodiment, the first edge clock generator 331_1' includes a delay chain DC1' and a logic circuit LC1. The delay chain DC1' delays the first clock CLK_A to generate a delayed first clock CLK_A'. In the embodiment, the delay chain DC1' includes even number of inverters IVT1(1) to INT1($m$) connected in series and bypass switches SWP1(1) to SWP1($n$). The bypass switches SWP1(1) to SWP1($n$) are controlled by a corresponding code bit of a first digital delay code DT1. For example, the bypass switch SWP1 is used to bypass the inverters IVT1(2) and IVT1(3) in response to a code bit DT<1> of a first digital delay code DT1. Similarly, the bypass switch SWP1($n$) is used to bypass the inverters IVT1($m$-2) and IVT1($m$-1). Therefore, the delay chain 331_1' may delay the first clock CLK_A in response to the first digital delay code DT1. The phase difference between the delayed first clock CLK_A' and the first clock CLK_A is associated with a code value of the first digital delay code DT1.

Figure 6:
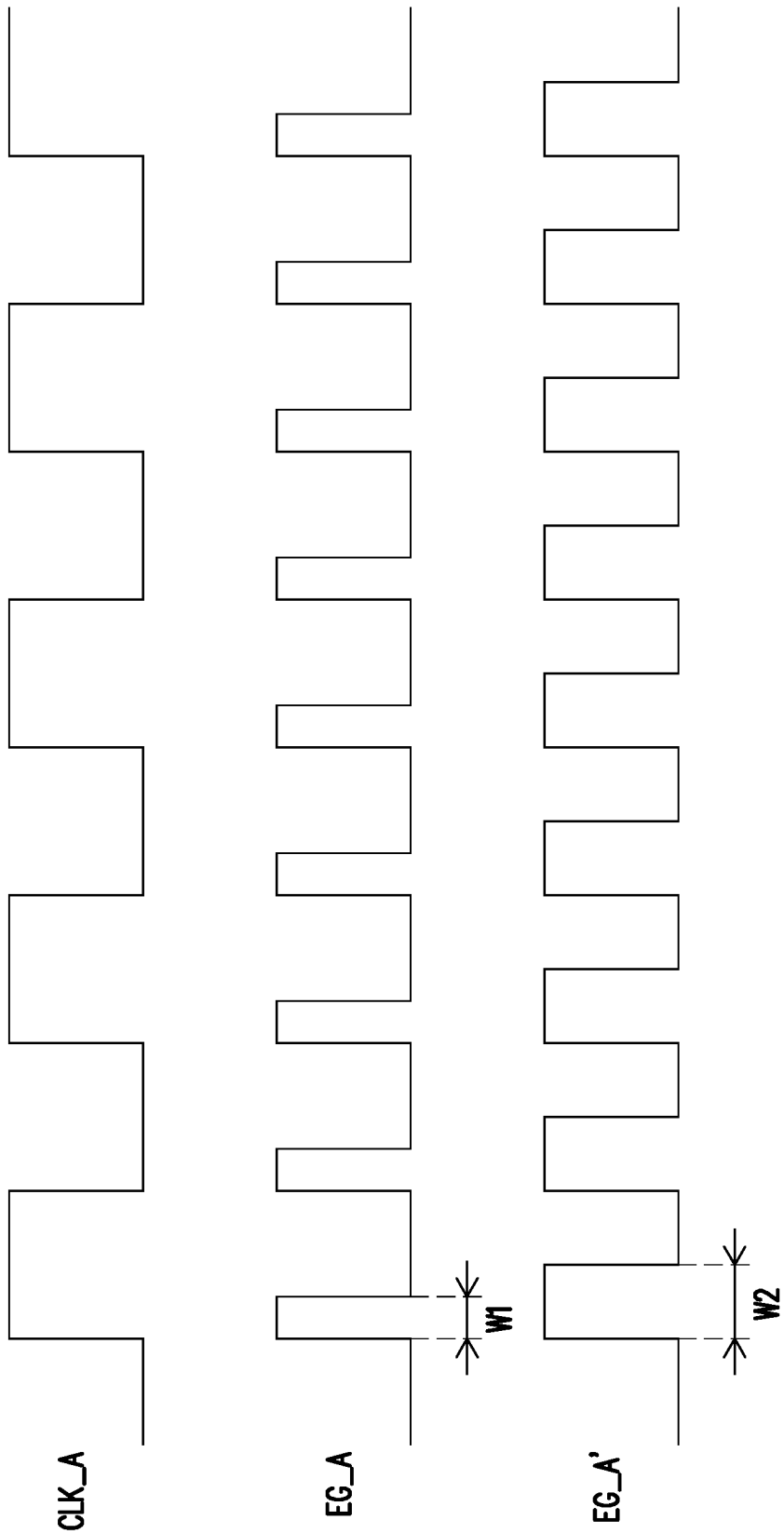
FIG. 6 illustrates an operating timing diagram of a first edge clock generator of FIG. 5.

FIG. 6 illustrates an operating timing diagram of a first edge clock generator of FIG. 5. Referring to FIG. 5 and FIG. 6, in the embodiment, the width of the positive pulses of the first edge clock EG_A may be adjusted by different code value of the first digital delay code DT1. For example, a width W1 of the positive pulses of the first edge clock EG_A is adjusted by a first code value of the first digital delay code DT1. A width W2 of the positive pulses of the first edge clock EG_A' is adjusted by a second code value of the first digital delay code DT1. The second code value is different from the first code value.

Referring to FIG. 5 again, in the embodiment, the second edge clock generator 331_2' includes a delay chain DC2' and a logic circuit LC2. The delay chain DC2' delays the second clock CLK_B to generate a delayed second clock CLK_B'. In the embodiment, the delay chain DC2' includes even number of inverters IVT2(1) to INT2($m$) connected in series and bypass switches SWP2(1) to SWP2($n$). The bypass switches SWP2(1) to SWP2($n$) are controlled by a corresponding code bit of a second digital delay code DT2. For example, the bypass switch SWP2 is used to bypass the inverters IVT2(2) and IVT2(3) in response to a code bit DT<1> of a second digital delay code DT2. Similarly, the bypass switch SWP2($n$) is used to bypass the inverters IVT2($m$-2) and IVT2($m$-1). Therefore, the delay chain 331_2' may delay the second clock in response to the second digital delay code DT2. The phase difference between the delayed second clock CLK_B' and the second clock CLK_B is associated with a code value of the second digital delay code DT2. In the embodiment, the width of the positive pulses of the second edge clock EG_B may be adjusted by different code value of the second digital delay code DT2.

In the embodiment, a bit number of the second digital delay code DT2 is equal to a bit number of the first digital delay code DT1. In some embodiments, the bit number of the second digital delay code DT2 is different from the bit number of the first digital delay code DT1.

In the embodiment, each of the bypass switches SWP1(1) to SWP1($n$) and SWP2(1) to SWP2($n$) may be implemented by a transmission gate or at least one transistor.

Figure 7:
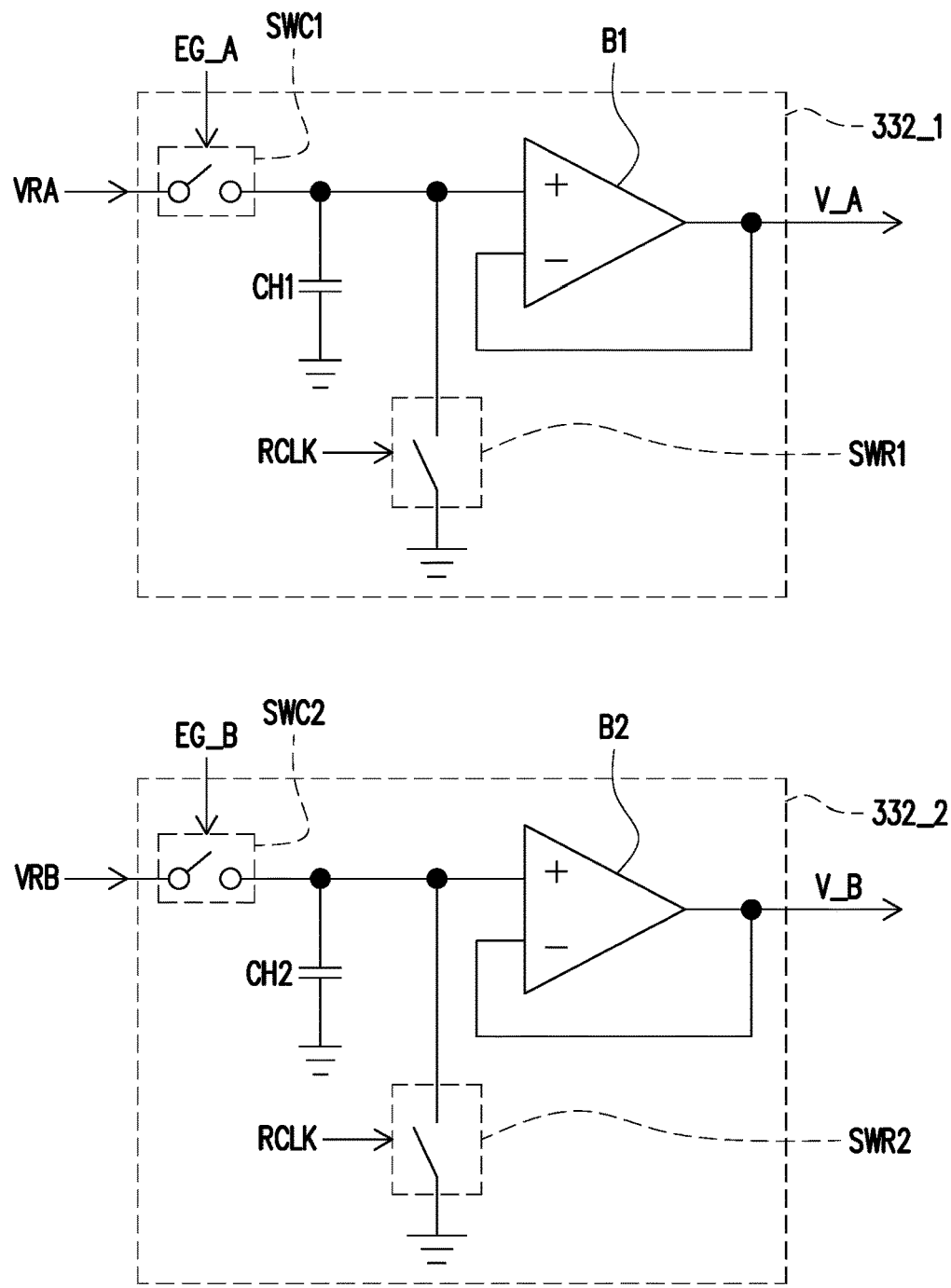
FIG. 7 illustrates a first sensing voltage generator and a second sensing voltage generator according to an embodiment of the disclosure.

FIG. 7 illustrates a first sensing voltage generator and a second sensing voltage generator according to an embodiment of the disclosure. Referring to FIG. 7, in the embodiment, the first sensing voltage generator 332_1 includes a charging switch SWC1, a capacitor CH1, a buffer B1 and a reset switch SWR1. A first terminal of the charging switch SWC1 receives the first reference voltage VRA. A control terminal of the charging switch SWC1 receives the first edge clock EG_A. The capacitor CH1 is coupled between a second terminal of the charging switch SWC1 and a low reference voltage. for example, the low reference voltage is ground. A non-inverting terminal of the buffer B1 is coupled to the second terminal of the charging switch SWC1. An inverting terminal of the buffer B1 is coupled to an output terminal of the buffer B 1. The output terminal of the buffer B1 is used to output the first sensing voltage V_A. A first terminal of the reset switch SWR1 is coupled to the second terminal of the charging switch SWC1. A second terminal of the reset switch SWR1 is coupled to the low reference voltage. A control terminal of the reset switch SWR1 receives a reset clock RCLK.

Figure 8:
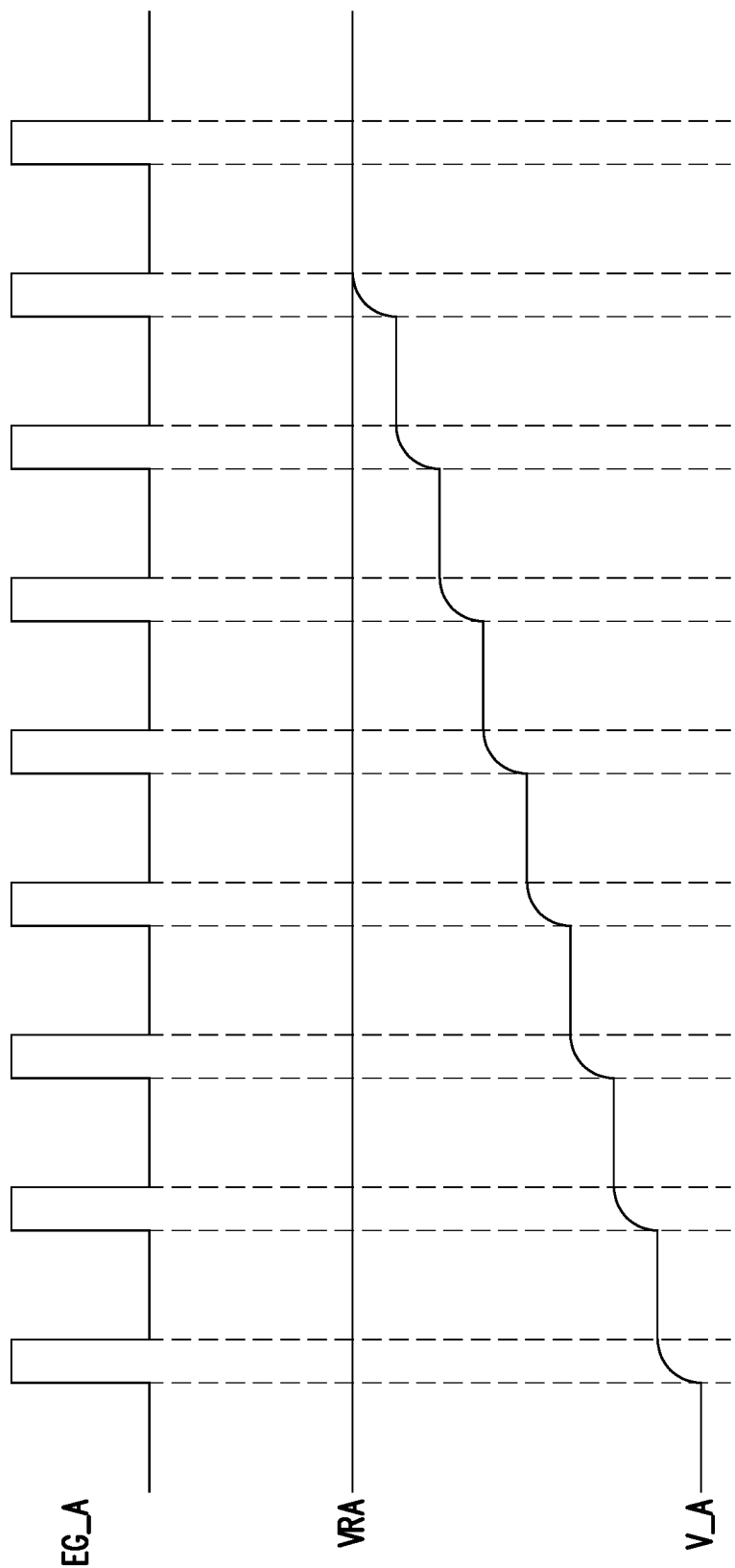
FIG. 8 illustrates an operating timing diagram of a first sensing voltage generator of FIG. 7.

FIG. 8 illustrates an operating timing diagram of a first edge clock generator of FIG. 7. Referring to FIG. 7 and FIG. 8, in the embodiment, during the sensing period, the charging switches SWC1 is operated by the first edge clock EG_A. The charging switches SWC1 is turned-on by the positive pulses of the first edge clock EG_A. Therefore, a raising speed of the voltage level of the first sensing voltage V_A is determined by the width of the positive pulses of the first edge clock EG_A and the frequency of the first edge clock EG_A. The first sensing voltage generator 332_1 raises the first sensing voltage V_A based on the positive pulses of the first edge clock EG_A during the sensing period until the first sensing voltage V_A reaches to the first reference voltage VRA.

When finishing the sensing period, the reset switch SWR1 is turned-on in response to a positive pulse of the reset clock RCLK. Therefore, the voltage of the first sensing voltage V_A is reset to a voltage level of the low reference voltage.

Referring to FIG. 7 again, in the embodiment, the second sensing voltage generator 332_2 includes a charging switch SWC2, a capacitor CH2, a buffer B2 and a reset switch SWR2. A first terminal of the charging switch SWC2 receives the second reference voltage VRB. A control terminal of the charging switch SWC2 receives the second edge clock EG_B. The capacitor CH2 is coupled between a second terminal of the charging switch SWC2 and the low reference voltage. A non-inverting terminal of the buffer B2 is coupled to the second terminal of the charging switch SWC2. An inverting terminal of the buffer B2 is coupled to an output terminal of the buffer B2. The output terminal of the buffer B2 is used to output the second sensing voltage V_B. A first terminal of the reset switch SWR2 is coupled to the second terminal of the charging switch SWC2. A second terminal of the reset switch SWR2 is coupled to the low reference voltage. A control terminal of the reset switch SWR2 receives the reset clock RCLK. The charging switches SWC2 is operated by the second edge clock EG_B. The charging switches SWC2 is turned-on by the positive pulses of the second edge clock EG_B. Therefore, a raising speed of the voltage level of the second sensing voltage V_B is determined by the width of the positive pulses of the second edge clock EG_B and the frequency of second edge clock EG_B. The second sensing voltage generator 332_2 raises the second sensing voltage V_B based on the positive pulses of the second edge clock EG_B during the sensing period until the second sensing voltage V_B reaches to the second reference voltage VRB.

When finishing the sensing period, the reset switch SWR2 is turned-on in response to a positive pulse of the reset clock RCLK. Therefore, the voltage of the second sensing voltage V_B is reset to a voltage level of the low reference voltage.

In the embodiment, each of the buffers B1 and B2 is an operational amplifier. Gains and bandwidths of the buffers B1 and B2 may be adjusted based on design requirements. Each of the charging switches SWC1, SWC2 and reset switches SWR1, SWR2 may be implemented by a transmission gate or at least one transistor. Each of the capacitors CH1, CH2 may be implemented by a physical capacitor element, a poly-insulator-poly (PIP) capacitor, a metal-insulator-metal (MIM) capacitor or a MOS capacitor, but the disclosure is not limited thereto.

Figure 9:
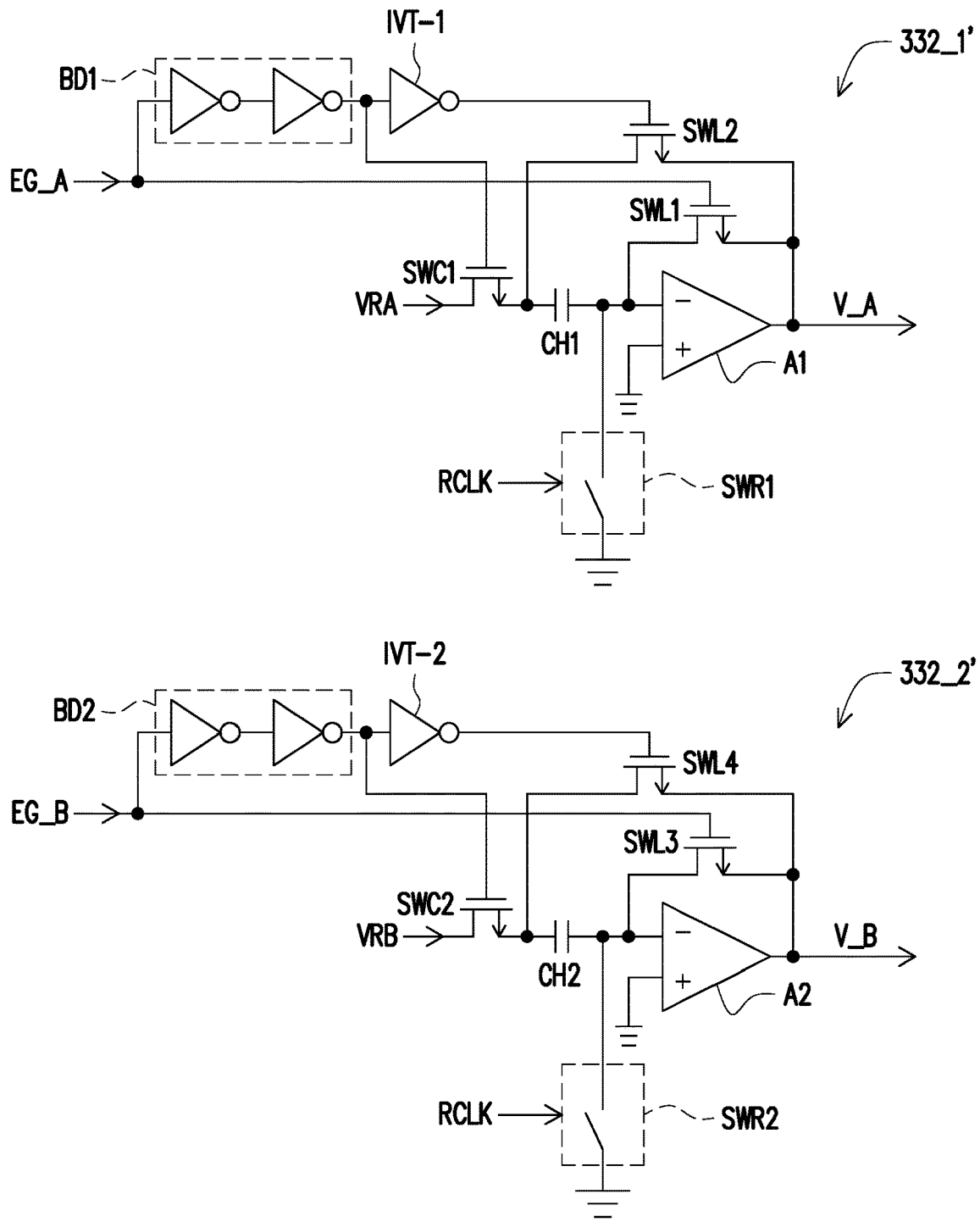
FIG. 9 illustrates a first sensing voltage generator and a second sensing voltage generator capable of decreasing a charge injection according to an embodiment of the disclosure.

FIG. 9 illustrates a first sensing voltage generator and a second sensing voltage generator capable of decreasing a charge injection according to an embodiment of the disclosure. Referring to FIG. 9, in the embodiment, the first sensing voltage generator 332-1' includes a delay buffer BD1, an inverter IVT-1, a charging switch SWC1, an amplifier A1, a capacitor CH1, loop switches SWL1, SWL2 and a reset switch SWR1.

An input terminal of the delay buffer BD1 receives the first edge clock EG_A. An input terminal of the inverter IVT-1 is coupled to an output terminal of the delay buffer BD1. A first terminal of the charging switch SWC1 receives the first reference voltage VRA. A control terminal of the charging switch SWC1 is coupled to the output terminal of the delay buffer BD1. A non-inverting terminal of the amplifier A1 is coupled to the low reference voltage. An output terminal of the amplifier A1 is used to output the first sensing voltage V_A. The capacitor CH1 is coupled between a second terminal of the charging switch SWC1 and an inverting terminal of the amplifier A1. A first terminal of the loop switch SWL1 is coupled to the inverting terminal of the amplifier A1. A second terminal of the loop switch SWL1 is coupled to the output terminal of the amplifier A1. A control terminal of the loop switch SWL1 receives the first edge clock EG_A. A first terminal of the loop switch SWL2 is coupled to a second terminal of the charging switch SWC1. A second terminal of the loop switch SWL2 is coupled to the output terminal of the amplifier A1. A control terminal of the loop switch SWL2 is coupled to an output terminal of the inverter IVT-1. A first terminal of the reset switch SWR1 is coupled to the inverting terminal of the amplifier A1. A second terminal of the reset switch SWR1 is coupled to the low reference voltage. A control terminal of the reset switch SWR1 receives the reset clock RCLK.

In the embodiment, the delay buffer BD1 delays the first edge clock EG_A by two gate delay time. Therefore, the charging switch SWC1 and the loop switches SWL1, SWL2 are turned-on at different time interval. At a first time interval, the loop switch SWL1 is turned-on by the first edge clock EG_A. The charging switch SWC1 and the loop switch SWL2 are turned-off. The loop switches SWL1 forms a loop between the output terminal of the amplifier A1 and the inverting terminal of the amplifier A1. The loop and the amplifier A1 forms a unit gain buffer. Therefore, a charge injection in the first sensing voltage generator 332-1' may be decreased by the unit gain buffer. At a second time interval after the first time interval, both the loop switch SWL1 and the charging switch SWC1 are turned-on, and the loop switch SWL2 are turned-off. The capacitor CH1 is charged by the first reference voltage VRA. Therefore, the amplifier A1 receives a charge hold on the capacitor CH1 and output the first sensing voltage V_A according to the charge hold on the capacitor CH1. Detailly, at the second time interval, the loop switches SWL1 and SWL2 are turned-off. A charge from the loop switch SWL1 flows to a right side of the capacitor CH1 and the inverting terminal of the amplifier A1. The inverting terminal of the amplifier A1 has performed a buffer connecting in a previous cycle. However, the inverting terminal of the amplifier A1 stores a charge in the previous cycle. Therefore, the charge injection caused by the loop switches SWL1 is decreased. Besides, under a proper gain, a voltage on the right side of the capacitor CH1 is maintained. Therefore, the charge injection caused by the loop switches SWL1 does not affect the voltage on the right side of the capacitor CH1. When a time point when the charging switch SWC1 is turned-off, a charge from the charging switch SWC1 flows to a left side of the capacitor CH1. At this time point, the left side of the capacitor CH1 has no discharge path. The right side of the capacitor CH1 is connected to the inverting terminal of the amplifier A1. Therefore, based on the conservation of charge, the capacitor CH1 suppresses the charge injection caused by the charging switch SWC1. Based on the above, the charge injections caused by the loop switches SWL1 and the charging switch SWC1 could be suppressed. At a third time interval after the second time interval, the loop switch SWL2 is turned-on. Both the charging switch SWC1 and the loop switch SWL1 are turned-off. The loop switches SWL2 forms a loop between the output terminal of the amplifier A1 and the second terminal of the charging switch SWC1. Therefore, a high gain amplifier circuit is formed by the amplifier A1, the capacitor CH1 and the loop (that is, the buffer connecting). The high gain amplifier circuit amplifies the charge hold on the capacitor CH1.

In the embodiment, the second sensing voltage generator 332-2' includes a delay buffer BD2, an inverter IVT-2, a charging switch SWC2, an amplifier A2, a capacitor CH2, loop switches SWL3, SWL4 and a reset switch SWR2.

An input terminal of the delay buffer BD2 receives the second edge clock EG_B. An input terminal of the inverter IVT-2 is coupled to an output terminal of the delay buffer BD2. A first terminal of the charging switch SWC2 receives the second reference voltage VRB. A control terminal of the charging switch SWC2 is coupled to the output terminal of the delay buffer BD2. A non-inverting terminal of the amplifier A2 is coupled to the low reference voltage. An output terminal of the amplifier A2 is used to output the second sensing voltage V_B. The capacitor CH2 is coupled between a second terminal of the charging switch SWC2 and an inverting terminal of the amplifier A2. A first terminal of the loop switch SWL3 is coupled to the inverting terminal of the amplifier A2. A second terminal of the loop switch SWL3 is coupled to the output terminal of the amplifier A2. A control terminal of the loop switch SWL3 receives the second edge clock EG_B. A first terminal of the loop switch SWL4 is coupled to a second terminal of the charging switch SWC2. A second terminal of the loop switch SWL4 is coupled to the output terminal of the amplifier A2. A control terminal of the loop switch SWL4 is coupled to an output terminal of the inverter IVT-2. A first terminal of the reset switch SWR2 is coupled to the inverting terminal of the amplifier A2. A second terminal of the reset switch SWR2 is coupled to the low reference voltage. A control terminal of the reset switch SWR2 receives the reset clock RCLK.

An operation of the second sensing voltage generator 332-2' is similar to above operation of the first sensing voltage generator 332-1', which is not repeated hereinafter. Besides, the voltage level of the first reference voltage VRA and the voltage level of the second reference voltage VRB may be the same each other or not. When a difference between the frequency of the clock ECLK and the frequency of the clock ICLK is very large, a difference between the first sensing voltage V_A and the second sensing voltage V_B may be large. Therefore, at least one of the first reference voltage VRA and the second reference voltage VRB may be adjusted, so as to decrease the large difference between the first sensing voltage V_A and the second sensing voltage V_B.

Figure 10:
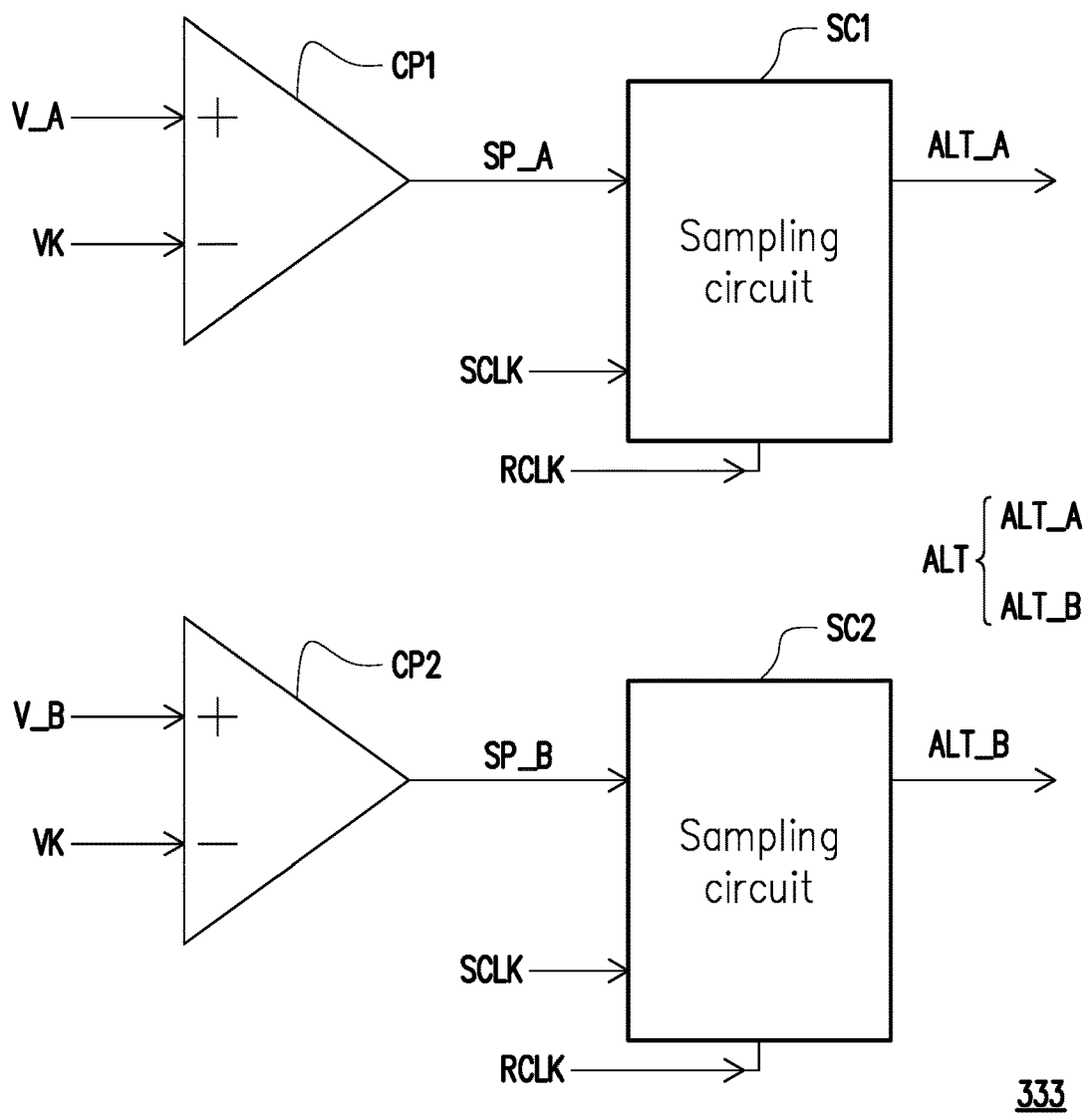
FIG. 10 illustrates a decision device according to an embodiment of the disclosure.

FIG. 10 illustrates a decision device according to an embodiment of the disclosure. Referring to FIG. 10, in the embodiment, the decision device 333 includes comparators CP1, CP2 and sampling circuits SC1, SC2. The comparator CP1 compares the first sensing voltage V_A with the decision voltage VK to provide the first result signal SP_A during the sensing period. The comparator CP2 compares the second sensing voltage V_B with the decision voltage VK to provide a second result signal SP_B during the sensing period.

In the embodiment, a non-inverting terminal of the comparator CP1 receives the first sensing voltage V_A. An inverting terminal of the comparator CP1 receives the decision voltage VK. If the voltage level of the first sensing voltage V_A is higher than a voltage level of the decision voltage VK, the comparator CP1 outputs the first result signal SP_A having a high voltage level. In other hand, if the voltage level of the first sensing voltage V_A is lower than the voltage level of the decision voltage VK, the comparator CP1 outputs the first result signal SP_A having a low voltage level. A non-inverting terminal of the comparator CP2 receives the second sensing voltage V_B. An inverting terminal of the comparator CP2 receives the decision voltage VK. If the voltage level of the second sensing voltage V_B is higher than a voltage level of the decision voltage VK, the comparator CP2 outputs the second result signal SP_B having a high voltage level. In other hand, if the voltage level of the second sensing voltage V_B is lower than the voltage level of the decision voltage VK, the comparator CP2 outputs the second result signal SP_B having a low voltage level.

The sampling circuit SC1 is coupled to the comparator CP1. The sampling circuit SC1 samples the first result signal SP_A as a first frequency comparing result ALT_A of the frequency comparing result ALT at a sampling time point. The sampling circuit SC2 is coupled to the comparator CP2. The sampling circuit SC2 samples the second result signal SP_B as a second frequency comparing result ALT_B of the frequency comparing result ALT at the sampling time point. In the embodiment, each of the sampling circuits SC1 and SC2 may be implemented by a Flip-flop. For example, each of the sampling circuits SC1 and SC2 may be implemented by a D Flip-flop. In the embodiment, the sampling time point is determined based on the sampling clock SCLK.

Figure 11A:
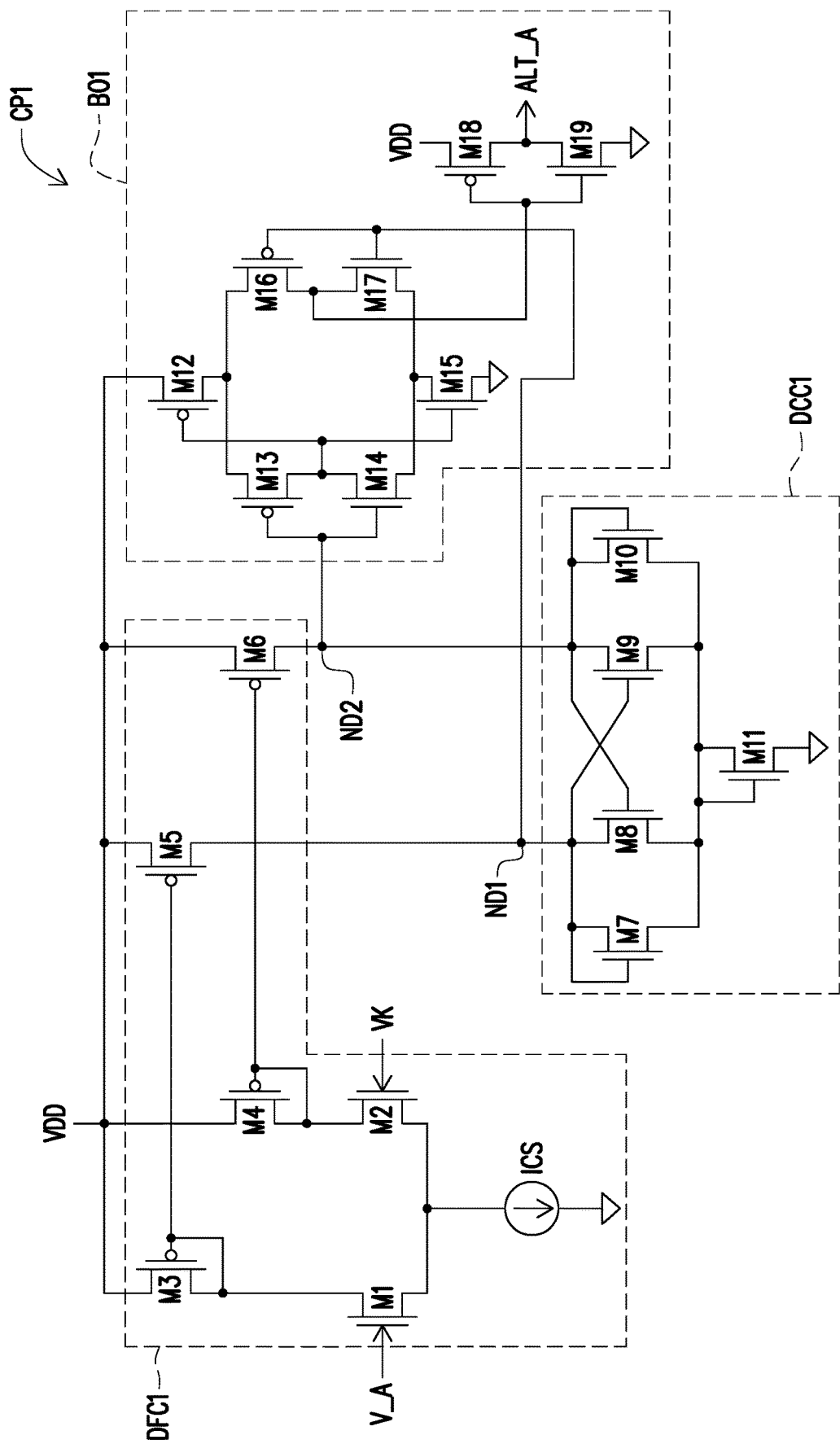
FIG. 11A illustrates a first comparator according to an embodiment of the disclosure.

FIG. 11A illustrates a first comparator according to an embodiment of the disclosure. Referring to FIG. 11A, in the embodiment, the comparator CP1 includes a differential circuit DFC1, an output buffer BO1 and a decision circuit DCC1. The differential circuit DFC1 receives the first sensing voltage V_A and the decision voltage VK. The output buffer BO1 outputs the first result signal SP_A. The decision circuit DCC1 is coupled to the differential circuit DFC1 and the output buffer BO1. The decision circuit DCC1 provides a first hysteresis region of a transition of the first result signal SP_A.

In the embodiment, the differential circuit DFC1 includes transistors M1 to M6 and a current scouse ICS. A control terminal of the transistor M1 receives the first sensing voltage V_A. A control terminal of the transistor M2 receives the decision voltage VK. A first terminal of the transistor M3 receives a high reference voltage VDD. A second terminal of the transistor M3 and a gate terminal of the transistor M3 are coupled to a first terminal of the transistor M1. A first terminal of the transistor M4 receives the high reference voltage VDD. A second terminal of the transistor M4 and a gate terminal of the transistor M4 are coupled to a first terminal of the transistor M2. A first terminal of current scouse ICS is coupled to a second terminal of the transistor M1 and a second terminal of the transistor M2. A second terminal of current scouse ICS is coupled to the low reference voltage. A first terminal of the transistor M5 receives the high reference voltage VDD. A second terminal of the transistor M5 is coupled to a node ND1. A control terminal of the transistor M5 is coupled to the gate terminal of the transistor M3. A first terminal of the transistor M6 receives the high reference voltage VDD. A second terminal of the transistor M6 is coupled to a node ND2. A control terminal of the transistor M6 is coupled to the gate terminal of the transistor M4. The transistors M3 and M5 are formed as a first current mirror. The transistors M4 and M6 are formed as a second current mirror.

The decision circuit DCC1 includes transistors M7 to M11. A first terminal of the transistor M7 and a control terminal of the transistor M7 are coupled to the node ND1. A first terminal of the transistor M8 is coupled to the node ND1. A control terminal of the transistor M8 is coupled to the node ND2. A first terminal of the transistor M9 is coupled to the node ND2. A control terminal of the transistor M9 is coupled to the node ND1. A first terminal of the transistor M10 and a control terminal of the transistor M10 are coupled to the node ND2. A first terminal of the transistor M11 and a control terminal of the transistor M11 are coupled to second terminals of the transistors M7 to M10. A second terminal of the transistor M11 is coupled to the low reference voltage. The transistor M11 is bias transistor for providing a bias voltage. In some embodiment, the transistor M11 may be omitted.

In the embodiment, each of the transistors M7 and M10 has a first aspect ratio. Each of the transistors M8 and M9 has a second aspect ratio. The first aspect ratio is different from the second aspect ratio. Further, the first aspect ratio is higher than the second aspect ratio. Therefore, the decision circuit DCC1 is a positive feedback decision circuit having a hysteresis function.

For example, the voltage level of the decision voltage VK is set as 2.5 V. The voltage level of the first result signal SP_A is transited from low to high when the first sensing voltage V_A is higher than 2.54 V. The voltage level of the first result signal SP_A is transited from high to low when the first sensing voltage V_A is lower than 2.46 V. Therefore, the hysteresis function avoids a glitch and/or a noise interference.

The output buffer B01 includes transistors M12 to M19. A first terminal of the transistor M12 receives the high reference voltage VDD. A first terminal of the transistor M13 is coupled to a second terminal of the transistor M12. A control terminal of the transistor M13 is coupled to the node ND2. A first terminal of the transistor M14 is coupled to a second terminal of the transistor M13 and a control terminal of the transistor M12. A control terminal of the transistor M14 is coupled to the node ND2. A first terminal of the transistor M15 is coupled to a second terminal of the transistor M14. A second terminal of the transistor M15 is coupled to the low reference voltage. A control terminal of the transistor M15 is coupled to the control terminal of the transistor M12. A first terminal of the transistor M16 is coupled to the second terminal of the transistor M12. A control terminal of the transistor M16 is coupled to the node ND1. A first terminal of the transistor M17 is coupled to a second terminal of the transistor M16. A second terminal of the transistor M17 is coupled to the first terminal of the transistor M15. A control terminal of the transistor M17 is coupled to the node ND1. A first terminal of the transistor M18 receives the high reference voltage VDD. A second terminal of the transistor M18 is an output terminal of the comparator CP1. A control terminal of the transistor M18 is coupled to the second terminal of the transistor M16. A first terminal of the transistor M19 is coupled to the second terminal of the transistor M18. A second terminal of the transistor M19 is coupled to the low reference voltage. A control terminal of the transistor M19 is coupled to the second terminal of the transistor M16.

In the embodiment, each of the transistors M1, M2, M7, M8, M9, M10, M11, M14, M15, M17 and M19 is NMOS. Each of the transistors M3, M4, M5, M6, M12, M13, M16, M18 is PMOS.

Figure 11B:
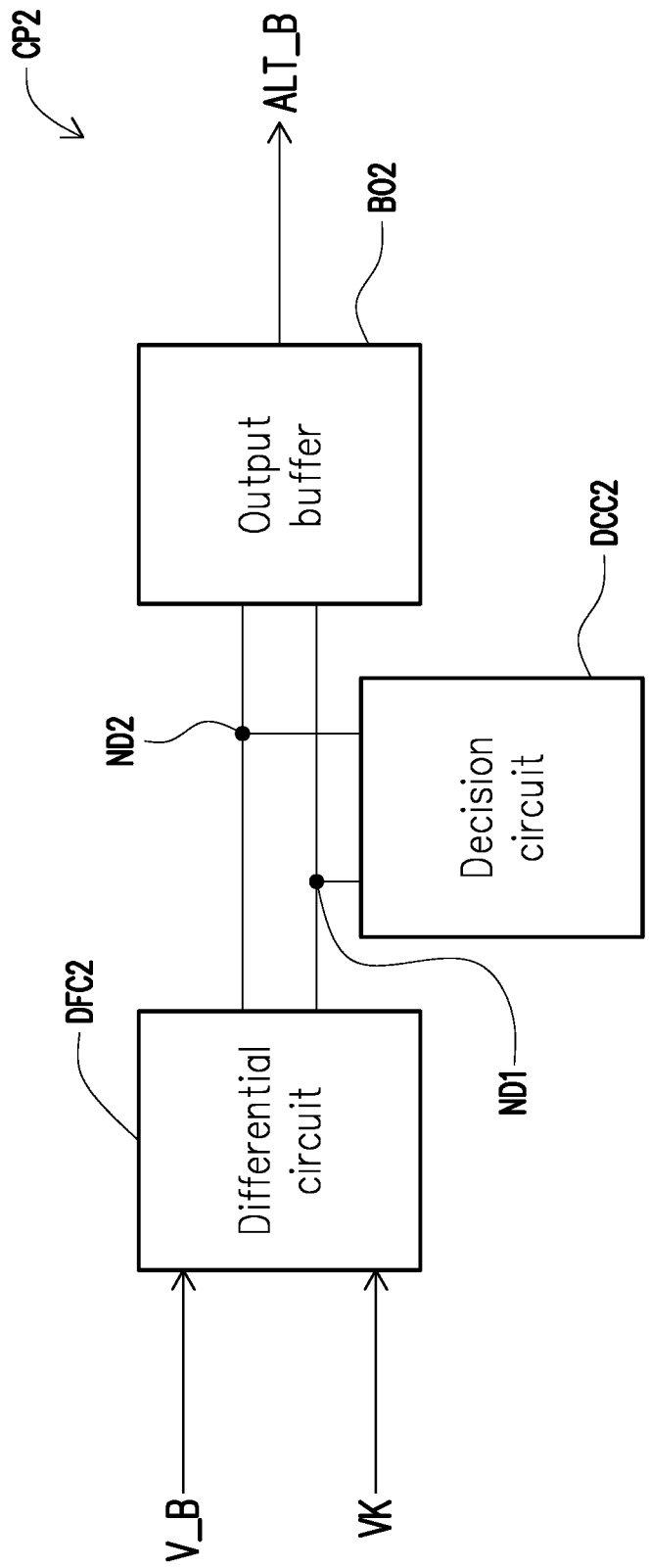
FIG. 11B illustrates a second comparator according to an embodiment of the disclosure.

FIG. 11B illustrates a second comparator according to an embodiment of the disclosure. Referring to FIG. 11B, in the embodiment, the comparator CP2 includes a differential circuit DFC2, an output buffer BO2 and a decision circuit DCC2. The differential circuit DFC2 receives the second sensing voltage V_B and the decision voltage VK. The output buffer BO2 outputs the second result signal SP_B. The decision circuit DCC2 is coupled to the differential circuit DFC2 and the output buffer BO2. The decision circuit DCC2 provides a second hysteresis region of a transition of the second result signal SP_B.

A detail design of the comparator CP2 can be inferred by referring to the relevant description of the comparator CP1, which is not repeated hereinafter.

Referring to FIG. 2, In some embodiments, the first edge clock generator 231_1 may be implemented by the first edge clock generator 331_1 as shown in FIG. 3 or the first edge clock generator 331_1' as shown in FIG. 5. The second edge clock generator 231_2 may be implemented by the second edge clock generator 331_2 as shown in FIG. 3 or the second edge clock generator 331_2' as shown in FIG. 5. The first sensing voltage generator 232_1 may be implemented by the first sensing voltage generator 332_1 as shown in FIG. 7 or the first sensing voltage generator 332_1' as shown in FIG. 9. The second sensing voltage generator 232_1 may be implemented by the second sensing voltage generator 332_2 as shown in FIG. 7 or the second sensing voltage generator 332_2' as shown in FIG. 9.

Figure 12:
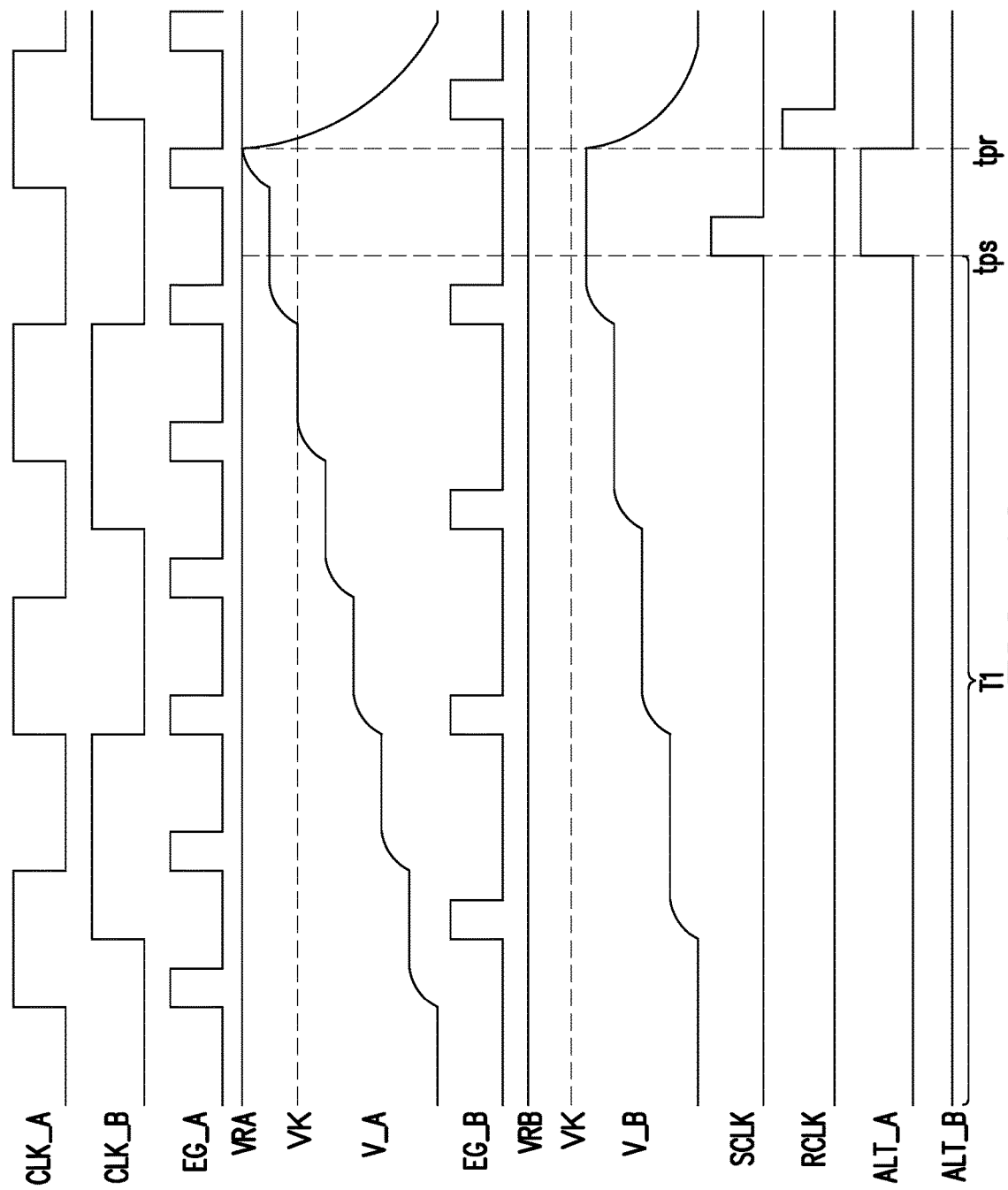
FIG. 12 illustrates an operating timing diagram of a frequency comparator according to an embodiment of the disclosure.

FIG. 12 illustrates an operating timing diagram of a frequency comparator according to an embodiment of the disclosure. Referring to FIG. 2 and FIG. 12, in the embodiment, during the sensing period T1, first edge clock generator 231_1 generates the first edge clock EG_A in response to the rising edge and the falling edge of the first clock CLK_A. The second edge clock generator 231_2 generates the second edge clock in response to the rising edge and the falling edge of the second clock CLK_B. The first sensing voltage generator 232_1 raises the first sensing voltage V_A based on the positive pulses of the first edge clock EG_A. The second sensing voltage generator 232_2 raises the second sensing voltage V_B based on the positive pulses of the second edge clock EG_B. In the embodiment, the frequency of the first clock CLK_A is higher than the frequency of the second clock CLK_B. Therefore, the raising speed of the voltage level of the first sensing voltage V_A is higher than the raising speed of the voltage level of the second sensing voltage V_B. Besides, the voltage level of the first reference voltage VRA and the voltage level of the second reference voltage VRB may be the same each other or not. When a difference between the frequency of the clock ECLK and the frequency of the clock ICLK is very large, a difference between the first sensing voltage V_A and the second sensing voltage V_B may be large. Therefore, at least one of the first reference voltage VRA and the second reference voltage VRB may be adjusted, so as to decrease the large difference between the first sensing voltage V_A and the second sensing voltage V_B.

In the embodiment, a voltage level of the first reference voltage VRA and a voltage level of the second reference voltage VRB are higher than the voltage level of the decision voltage VK and lower than a voltage level of the high reference voltage VDD. For example, the voltage level of the high reference voltage VDD is 5 V. The voltage level of the decision voltage VK is 2.5 V. The voltage level of the first reference voltage VRA is 3.5 V. The voltage level of the second reference voltage VRB is 3.5 V. In some embodiment, the voltage level of the first reference voltage VRA is different from the voltage level of the second reference voltage VRB. The voltage level of the first reference voltage VRA and the voltage level of the second reference voltage VRB may be adjusted based on design requirements.

The decision device 233 compares the first sensing voltage V_A with the decision voltage VK during the sensing period. The decision device 233 compares the second sensing voltage V_B with the decision voltage VK during the sensing period.

In the embodiment, the sampling time point tps is determined by a rising edge of the sampling clock SCLK. At the sampling time point tps, the decision device 233 determine the voltage level of the first sensing voltage V_A is higher than the voltage level of the decision voltage VK. Therefore, the decision device 233 provides the first frequency comparing result ALT_A having a high voltage level at the sampling time point tps. Besides, the decision device 233 determine the voltage level of the second sensing voltage V_B is lower than the voltage level of the decision voltage VK. Therefore, the decision device 233 provides the second frequency comparing result ALT_B having a low voltage level at the sampling time point tps.

Referring to FIG. 2, FIG. 12 and TABLE 1, TABLE 1 is a true table of the first frequency comparing result ALT_A the second frequency comparing result ALT_B.

TABLE 1

| ALT_A | ALT_B | Description |
|---|---|---|
| L | L | the period of the sampling clock SCLK is too short |
| L | H | the frequency of the first clock CLK_A is lower than the frequency of the second clock CLK_B |
| H | L | the frequency of the first clock CLK_A is higher than the frequency of the second clock CLK_B |
| H | H | the period of the sampling clock SCLK is too long |

Based on the first frequency comparing result ALT_A having a high voltage level ("H") and the second frequency comparing result ALT_B having a low voltage level ("L"), the frequency of the first clock CLK_A is determined to be higher than the frequency of the second clock CLK_B.

Based on the first frequency comparing result ALT_A having the low voltage level ("L") and the second frequency comparing result ALT_B having the high voltage level ("H"), the frequency of the first clock CLK_A is determined to be lower than the frequency of the second clock CLK_B.

Based on the first frequency comparing result ALT_A having the low voltage level ("L") and the second frequency comparing result ALT_B having the low voltage level ("L"), the period of the sampling clock SCLK is determined to be too short. In other words, the sensing period is too short. In the embodiment, in order to eliminate the above situation, the period of the sampling clock SCLK must be adjusted. In some embodiments, in order to eliminate the above situation, the width of the positive pulses of the first edge clock EG_A the width of the positive pulses of the second edge clock EG_B may be enlarged.

Based on the first frequency comparing result ALT_A having the high voltage level ("H") and the second frequency comparing result ALT_B having the high voltage level, the period of the sampling clock SCLK is determined to be too long. In other words, the sensing period is too long. In the embodiment, in order to eliminate the above situation, the period of the sampling clock SCLK must be adjusted. In some embodiments, in order to eliminate the above situation, the width of the positive pulses of the first edge clock EG_A the width of the positive pulses of the second edge clock EG_B may be narrowed. In the embodiment, based on based on design requirements, the voltage level of the first reference voltage VRA and the voltage level of the second reference voltage VRB may be decreased a little and/or the voltage level of the decision voltage VK may be increased a little.

It should be noted, as previously description, the frequency of the first edge clock EG_A are associated with the frequency of the clock ICLK. The frequency of the second edge clock EG_B are associated with the frequency of the clock ECLK. Therefore, based on the first frequency comparing result ALT_A and the second frequency comparing result ALT_B of the frequency comparing result ALT, the frequency relationship between the frequency of the clock ECLK and the frequency of the clock ICLK would be obtained. The frequency relationship can help the chip receiving the clock ECLK to optimize the power consumption and the performance.

Referring to FIG. 2 and FIG. 12 again, in the embodiment, a reset time point tpr is determined by a rising edge of the reset clock RCLK. At the sampling time point tps, the first sensing voltage generator 232_1 resets the first sensing voltage V_A to the voltage level of the low reference voltage in response to the reset clock RCLK. the second sensing voltage generator 232_2 resets the second sensing voltage V_B to the voltage level of the low reference voltage in response to the reset clock RCLK. Besides, the decision device 233 resets the first frequency comparing result ALT_A having the low voltage level and the second frequency comparing result ALT_B to the low voltage level in response to the reset clock RCLK.

In view of the foregoing, the first clock converting circuit converts the internal clock to the first clock. The second clock converting circuit converts the external clock to the second clock. The frequency comparator generates the first sensing voltage based on the first clock and generates the second sensing voltage based on the second clock. The frequency comparator compares the first sensing voltage and the second sensing voltage to provide the frequency comparing result between the external clock and the internal clock. Therefore, the frequency relationship between the frequency of the external clock and the frequency of the internal clock would be obtained. Besides, in some embodiments, the frequency comparator generate the first edge clock in response to the first clock and generate the second edge clock in response to the second clock. The frequency comparator generates the first sensing voltage based on the width and the number of the positive pulses of the first edge clock, and generates the second sensing voltage based on the width and the number of the positive pulses of the second edge clock. The frequency comparator compares the first sensing voltage and the second sensing voltage to provide the frequency comparing result. Therefore, the clock detecting circuit determines the frequency relationship between the frequency of the external clock and the frequency of the internal clock according to the frequency comparing result. The clock detecting circuit may optimize a setting value of various components (such as receiver, PLL, DLL, POR, transmitter circuit, etc.) inside the chip, so as to save power consumption or optimize a setting of signal quality according to the frequency relationship.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A clock detecting circuit, comprising:
 a first clock converting circuit, configured to receive an internal clock, and convert the internal clock to a first clock;
 a second clock converting circuit, configured to receive an external clock, and convert the external clock to a second clock;
 a frequency comparator, coupled to the first clock converting circuit and the second clock converting circuit, configured to:
  generate a first edge clock in response to a signal edge of the first clock and generate a second edge clock in response to a signal edge of the second clock,
  generate a first sensing voltage in response to a plurality of positive pulses of the first edge clock and generate a second sensing voltage in response to a plurality of positive pulses of the second edge clock, and
  compare the first sensing voltage and the second sensing voltage to provide a frequency comparing result between the external clock and the internal clock.

2. The clock detecting circuit of claim 1, wherein the frequency comparator comprises:
 a first edge clock generator, coupled to the first clock converting circuit, configured to generate the first edge clock in response to least one of a rising edge and a falling edge of the first clock; and
 a second edge clock generator, coupled to the second clock converting circuit, configured to generate the second edge clock in response to least one of a rising edge and a falling edge of the second clock.

3. The clock detecting circuit of claim 2, wherein the first edge clock generator comprises:
 a first delay chain, configured to delay the first clock to generate a delayed first clock; and a first logic circuit, configured receive the delayed first clock and the first clock, and generate the first edge clock based on a phase difference between the delayed first clock and the first clock, wherein a width of the plurality of positive pulses of the first edge clock is associated with phase difference between the delayed first clock and the first clock.

4. The clock detecting circuit of claim 3, wherein the first delay chain delays the first clock in response to a first digital delay code, and wherein the phase difference between the delayed first clock and the first clock is associated with a code value of the first digital delay code.

5. The clock detecting circuit of claim 3, wherein the second edge clock generator comprises:

a second delay chain, configured to delay the second clock to generate a delayed second clock; and a second logic circuit, configured receive the delayed second clock and the second clock, and generate the second edge clock based on a phase difference between the delayed second clock and the second clock, wherein a width of the plurality of positive pulses of the second edge clock is associated with phase difference between the delayed second clock and the second clock.

6. The clock detecting circuit of claim 5, wherein the second delay chain delays the second clock in response to a second digital delay code, and wherein the phase difference between the delayed second clock and the second clock is associated with a code value of the second digital delay code.

7. The clock detecting circuit of claim 1, wherein the frequency comparator comprises:

a first sensing voltage generator, configured to generate the first sensing voltage based on the plurality of positive pulses of the first edge clock; and a second sensing voltage generator, configured to generate the second sensing voltage based on the plurality of positive pulses of the second edge clock.

8. The clock detecting circuit of claim 7, wherein the first sensing voltage generator comprises:

a first charging switch, wherein a first terminal of the first charging switch receives a first reference voltage, and a control terminal of the first charging switch receives the first edge clock;

a first capacitor, coupled between a second terminal of the first charging switch and a low reference voltage;

a first buffer, wherein a non-inverting terminal of the first buffer is coupled to the second terminal of the first charging switch, an inverting terminal of the first buffer is coupled to an output terminal of the first buffer, and the output terminal of the first buffer is used to output the first sensing voltage; and a first reset switch, wherein a first terminal of the first reset switch is coupled to the second terminal of the first charging switch, a second terminal of the first reset switch is coupled to the low reference voltage, and a control terminal of the first reset switch receives a reset clock.

9. The clock detecting circuit of claim 8, wherein the second sensing voltage generator comprises:

a second charging switch, wherein a first terminal of the second charging switch receives a second reference voltage, and a control terminal of the second charging switch receives the second edge clock;

a second capacitor, coupled between a second terminal of the second charging switch and a low reference voltage;

a second buffer, wherein a non-inverting terminal of the second buffer is coupled to the second terminal of the second charging switch, an inverting terminal of the second buffer is coupled to an output terminal of the second buffer, and the output terminal of the second buffer is used to output the second sensing voltage; and a second reset switch, wherein a first terminal of the second reset switch is coupled to the second terminal of the second charging switch, a second terminal of the second reset switch is coupled to the low reference voltage, and a control terminal of the second reset switch receives the reset clock.

10. The clock detecting circuit of claim 7, wherein the first sensing voltage generator comprises:

a first delay buffer, wherein an input terminal of the first delay buffer receives the first edge clock;

a first inverter, wherein an input terminal of the first inverter is coupled to an output terminal of the first delay buffer;

a first charging switch, wherein a first terminal of the first charging switch receives a first reference voltage, and a control terminal of the first charging switch is coupled to the output terminal of the first delay buffer;

a first amplifier, wherein a non-inverting terminal of the first amplifier is coupled to a low reference voltage, and an output terminal of the first amplifier is used to output the first sensing voltage;

a first capacitor, coupled between a second terminal of the first charging switch and an inverting terminal of the first amplifier;

a first loop switch, wherein a first terminal of the first loop switch is coupled to the inverting terminal of the first amplifier, a second terminal of the first loop switch is coupled to the output terminal of the first amplifier, and a control terminal of the first loop switch receives the first edge clock;

a second loop switch, wherein a first terminal of the second loop switch is coupled to a second terminal of the first charging switch, a second terminal of the second loop switch is coupled to the output terminal of the first amplifier, and a control terminal of the second loop switch is coupled to an output terminal of the first inverter; and a first reset switch, wherein a first terminal of the first reset switch is coupled to the inverting terminal of the first amplifier, a second terminal of the first reset switch is coupled to the low reference voltage, and a control terminal of the first reset switch receives a reset clock.

11. The clock detecting circuit of claim 10, wherein the second sensing voltage generator comprises:

a second delay buffer, wherein an input terminal of the second delay buffer receives the second edge clock;

a second inverter, wherein an input terminal of the second inverter is coupled to an output terminal of the second delay buffer;

a second charging switch, wherein a first terminal of the second charging switch receives a second reference voltage, and a control terminal of the second charging switch is coupled to the output terminal of the second delay buffer;

a second amplifier, wherein a non-inverting terminal of the second amplifier is coupled to the low reference voltage, and an output terminal of the second amplifier is used to output the second sensing voltage;

a second capacitor, coupled between a second terminal of the second charging switch and an inverting terminal of the second amplifier;

a third loop switch, wherein a first terminal of the third loop switch is coupled to the inverting terminal of the second amplifier, a second terminal of the third loop switch is coupled to the output terminal of the second amplifier, and a control terminal of the third loop switch receives the second edge clock;

a fourth loop switch, wherein a first terminal of the fourth loop switch is coupled to a second terminal of the second charging switch, a second terminal of the fourth loop switch is coupled to the output terminal of the second amplifier, and a control terminal of the fourth loop switch is coupled to an output terminal of the second inverter; and a second reset switch, wherein a first terminal of the second reset switch is coupled to the inverting terminal of the second amplifier, a second terminal of the second reset switch is coupled to the low reference voltage, and a control terminal of the second reset switch receives the reset clock.

12. The clock detecting circuit of claim 1, wherein the frequency comparator comprises:
a decision device, configured to receive the first sensing voltage and the second sensing voltage, compare the first sensing voltage with a decision voltage to provide a first result signal during a sensing period, compare the second sensing voltage with the decision voltage to provide a second result signal during the sensing period, and sample the first result signal and the second result signal as the frequency comparing result based on a sampling clock,
wherein the sensing period is associated with a period of the sampling clock.

13. The clock detecting circuit of claim 12, wherein the decision device comprises:
a first comparator, configured to compare the first sensing voltage with the decision voltage to provide the first result signal during the sensing period;
a second comparator, configured to compare the second sensing voltage with the decision voltage to provide the second result signal during the sensing period;
a first sampling circuit, coupled to the first comparator, configured to sample the first result signal as a first frequency comparing result of the frequency comparing result at a sampling time point; and
a second sampling circuit, coupled to the second comparator, configured to sample the second result signal as a second frequency comparing result of the frequency comparing result at the sampling time point.

14. The clock detecting circuit of claim 13, wherein the first comparator comprises:
a first differential circuit, configured to receive the first sensing voltage and the decision voltage;

a first output buffer, configured to output the first result signal; and
a first decision circuit, coupled to the first differential circuit and the first output buffer, and configured to provide a first hysteresis region of a transition of the first result signal.

15. The clock detecting circuit of claim 14, wherein the second comparator comprises:
a second differential circuit, configured to receive the second sensing voltage and the decision voltage;
a second output buffer, configured to output the second result signal; and
a second decision circuit, coupled to the second differential circuit and the second output buffer, and configured to provide a second hysteresis region of a transition of the second result signal.

16. A clock detecting circuit, comprising:
a first sensing voltage generator, configured to generate a first sensing voltage based on a frequency of a first clock associated with a clock on a first signal path;
a second sensing voltage generator, configured to generate a second sensing voltage based on a frequency of a second clock associated with a clock on a second signal path; and
a decision device, coupled to the first voltage generator and the second voltage generator, configured to compare the first sensing voltage with a decision voltage to provide a first result signal, compare the second sensing voltage with the decision voltage to provide a second result signal, and sample the first result signal and the second result signal as a frequency comparing result.

17. The clock detecting circuit of claim 16, further comprises a frequency dividing circuit, configured to convert the clock on a first signal path to the first clock.

18. The clock detecting circuit of claim 16, wherein the decision device comprises:
a first comparator, configured to compare the first sensing voltage with the decision voltage to provide the first result signal during a sensing period; and
a second comparator, configured to compare the second sensing voltage with the decision voltage to provide the second result signal during the sensing period.

19. The clock detecting circuit of claim 18, wherein the decision device comprises:
a first sampling circuit, coupled to the first comparator, configured to sample the first result signal as a first frequency comparing result of the frequency comparing result at a sampling time point; and
a second sampling circuit, coupled to the second comparator, configured to sample the second result signal as a second frequency comparing result of the frequency comparing result at the sampling time point.

* * * * *